United States Patent [19]

Turski et al.

[11] 3,959,747
[45] May 25, 1976

[54] METALLIZED LITHIUM NIOBATE AND METHOD OF MAKING

[75] Inventors: Zygmond Turski, Trevose, Pa.; John Louis Vossen, Jr., Somerville, N.J.

[73] Assignee: RCA Corporation, New York, N.Y.

[22] Filed: Apr. 30, 1975

[21] Appl. No.: 573,390

[52] U.S. Cl. .............................. 333/30 R; 29/25.35; 310/9.7; 333/72
[51] Int. Cl.² ...................... H03H 9/04; H03H 9/30; H01L 41/18; H01L 41/22
[58] Field of Search .......................... 333/30 R, 72; 252/62.9 R; 310/8–9.7; 29/25.35

[56] References Cited
UNITED STATES PATENTS 3,891,873   6/1975   Yanagisawa et al. ................. 310/9.7

*Primary Examiner*—Alfred E. Smith
*Assistant Examiner*—Marvin Nussbaum
*Attorney, Agent, or Firm*—Glenn H. Bruestle; Arthur E. Wilfond; Birgit E. Morris

[57] ABSTRACT

A body of lithium niobate coated with a first thin layer of magnesium and a second conductive metal layer on the magnesium layer permits subsequent ultrasonic bonding of a wire to the second layer without problems of delamination.

10 Claims, 1 Drawing Figure

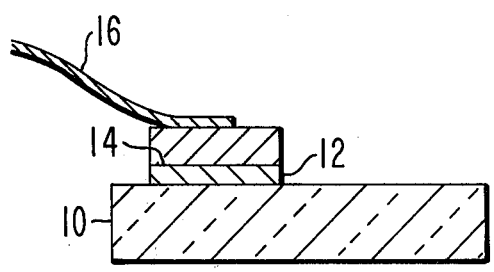

METALLIZED LITHIUM NIOBATE AND METHOD OF MAKING

The invention herein described was made in the course of or under a contract with the U.S. Government.

This invention relates to a metallized lithium niobate body. More particularly, this invention relates to a lithium niobate body having an electrode thereon to which a wire can be ultrasonically bonded.

BACKGROUND OF THE INVENTION

Microsonic acoustic wave devices employ materials having acousto-electric properties wherein high frequency acousttic waves are generated by applying electric potentials. Low loss broadband acoustic delay lines, for example, comprise single crystal wafers of lithium niobate having conductive elements deposited thereon. The surface of the lithium niobate crystal, after polishing to the desired thickness, which can be on the order of less than about one micron, is metallized so as to be able to bond a wire onto the lithium niobate crystal by a room temperature, ultrasonic bonding process. The metal film on the lithium niobate must be strongly adherent to the lithium niobate crystal to avoid delamination during and after the ultrasonic bonding step. Conventional adherent metal layers, such as chromium, titanium, tantalum and the like, have proven to be inadequately adherent to lithium niobate crystals. A conventional chromium-gold layer on a lithium niobate crystal completely delaminated when subjected to an ultrasonic bonding step. Thus in order to make practicable acoustic devices using lithium niobate, an adherent bonding metal has been sought.

SUMMARY OF THE INVENTION

We have found that a thin layer of magnesium adheres strongly to single crystals of lithium niobate and can be subsequently metallized so that a wire can be ultrasonically bonded to the metal layer without delamination. Further, magnesium can be applied under mild conditions at low temperatures which avoids any adverse effects on the properties of the lithium niobate crystal.

BRIEF DESCRIPTION OF THE DRAWING

The FIGURE is a cross sectional view of an acoustic delay line embodying the invention.

DETAILED DESCRIPTION OF THE INVENTION

A novel acoustic delay line comprises a single crystal lithium niobate wafer, a first thin layer of magnesium on at least a portion of the surface thereof, and a second layer of another conductive metal on the magnesium layer. These devices are made by depositing a first layer of magnesium onto a surface of a single crystal of lithium niobate and depositing a second layer of a different metal onto the magnesium layer. The magnesium layer bonds strongly both to the lithium niobate crystal surface and to the metal layer and is in a low enough state of stress so that no delamination occurs during a subsequent ultrasonic bonding step, which bonds a wire to the conductive metal layer.

Referring now to the FIGURE, a lithium niobate crystal 10 has a thin layer of magnesium 12 on one surface thereof and a thicker layer 14 of a conductive metal such as aluminum over the magnesium layer 12. An aluminum wire 16 is ultrasonically bonded to the aluminum layer 14.

The magnesium layer 12 can be deposited in conventional manner, as by vacuum evaporation or sputtering. Vacuum evaporation can be carried out at a temperature of about 50°–200°C. At higher temperatures, above about 200°C., the deposited magnesium re-evaporates at a rate approaching the deposition rate.

The conductive metal layer 14 can also be deposited by vacuum evaporation or sputtering in similar manner. Preferably, the lithium niobate crystal is cooled to room temperature prior to deposition of the conductive metal layer, to prevent migration of magnesium ions into the conductive metal layer.

The thickness of the magnesium layer and the conductive metal layer is not critical. A layer of magnesium as thin as 200 angstroms is adequate to form a strong bond to the lithium niobate crystal. In general, a thickness of from about 200 to 2000 angstroms will be applied to the lithium niobate crystal. The conductive metal layer is typically from about 1000 to 2000 angstroms thick.

The conductive metal layer is chosen so that it does not form brittle intermetallic layers with magnesium or a highly stressed interface with the magnesium layer. Suitable conductive metal layer can be of aluminum or alloys thereof, gold, platinum, their alloys and the like. Aluminum is preferred.

The wire 16 can be successfully ultrasonically bonded to the metal layer 14. The wire 16 can be a one mil aluminum wire for example.

The metal layers 12 and 14 can be patterned if desired using conventional photolithographic techniques whereby a photoresist film is applied onto the surface of the metal layer, the photoresist exposed through a mask to change the solubilities of the exposed and unexposed regions of the resist, developed with a developer solvent to dissolve away the soluble portions of the resist, the exposed metal layer etched away and the remaining resist film removed from the surface of the remaining, patterned metal layer.

We claim:

1. An acoustic delay line comprising a single crystal of lithium niobate, a first layer of magnesium metal on at least a portion of the surface of said crystal and a second layer of another conductive metal on said magnesium layer.

2. A delay line according to claim 1 wherein said magnesium layer is from about 200 to about 2000 angstroms thick.

3. A delay line according to claim 1 wherein said conductive layer is from about 1000 to about 2000 angstroms thick.

4. A delay line according to claim 3 wherein said conductive metal is aluminum.

5. A delay line according to claim 1 having a wire bonded to said conductive metal.

6. A delay line according to claim 5 wherein said wire is an aluminum wire.

7. The method of bonding a wire to an electrode deposited on a lithium niobate single crystal which comprises depositing a first layer of magnesium on said lithium niobate crystal, depositing a second layer of a conductive metal on said magnesium layer and ultrasonically bonding a wire to said conductive metal layer.

8. The method according to claim 7 wherein said first deposition is continued until said magnesium layer is at least about 200 angstroms thick.

9. The method according to claim 7 wherein said magnesium layer is deposited by vacuum evaporation at a temperature from about 50°C. up to about 200°C.

10. The method according to claim 9 wherein said first deposition evaporates magnesium until said layer is from about 200 to about 2000 angstroms thick and wherein said second metal layer is aluminum evaporated until said layer is from about 1000 to 2000 angstroms thick.

* * * * *